United States Patent [19]

Patten et al.

[11] 4,305,801
[45] Dec. 15, 1981

[54] LINE-OF-SIGHT DEPOSITION METHOD

[75] Inventors: James W. Patten; Edwin D. McClanahan, both of Richland; Michael A. Bayne, West Richland, all of Wash.

[73] Assignee: The United States of America as represented by the United States Department of Energy, Washington, D.C.

[21] Appl. No.: 140,948

[22] Filed: Apr. 16, 1980

[51] Int. Cl.$^3$ .............................................. C23C 15/00
[52] U.S. Cl. .............................. 204/192 R; 427/248.1; 427/255.5
[58] Field of Search .............. 204/192 R, 192 C, 298; 427/248 R, 248 G

[56] References Cited

U.S. PATENT DOCUMENTS

| | | | |
|---|---|---|---|
| 3,494,852 | 2/1970 | Doctoroff | 204/298 |
| 3,494,853 | 2/1970 | Anderson et al. | 204/298 |
| 3,654,123 | 4/1972 | Hajzak | 204/298 |
| 3,669,860 | 6/1972 | Knowles et al. | 204/192 |
| 3,711,398 | 1/1973 | Clarke | 204/298 |
| 3,761,375 | 9/1973 | Pierce et al. | 204/192 |
| 3,779,891 | 12/1973 | Vegh et al. | 204/298 |
| 3,829,373 | 8/1974 | Kuehnle | 204/298 |
| 3,925,187 | 12/1975 | Bernard | 204/298 |
| 3,939,052 | 2/1976 | Riley | 204/192 |
| 4,014,779 | 3/1977 | Kuehnle | 204/298 |
| 4,022,947 | 5/1977 | Grubb et al. | 428/432 |
| 4,119,881 | 10/1978 | Calderon | 313/360 |

OTHER PUBLICATIONS

J. W. Patten, "The Influences of Surface Topography and Angle of Adatom Incidence on Growth Structure in Sputtered Chromium," *Thin Solid Films*, vol. 63, pp. 121-129 (1979).

Y. Hoshi et al., "High Rate Deposition of Iron Films By Sputtering from Two Facing Targets," *Japan J. Appl. Phys.*, vol. 16, pp. 1715-1716 (1977).

*Primary Examiner*—Aaron Weisstuch
*Attorney, Agent, or Firm*—Hugh W. Glenn; Robert J. Fisher; Richard G. Besha

[57] ABSTRACT

A line-of-sight method of depositing a film having substantially 100% of theoretical density on a substrate. A pressure vessel contains a target source having a surface thereof capable of emitting particles therefrom and a substrate with the source surface and the substrate surface positioned such that the source surface is substantially parallel to the direction of the particles impinging upon the substrate surface, the distance between the most remote portion of the substrate surface receiving the particles and the source surface emitting the particles in a direction parallel to the substrate surface being relatively small. The pressure in the vessel is maintained less than about 5 microns to prevent scattering and permit line-of-sight deposition. By this method the angles of incidence of the particles impinging upon the substrate surface are in the range of from about 45° to 90° even when the target surface area is greatly expanded to increase the deposition rate.

13 Claims, 1 Drawing Figure

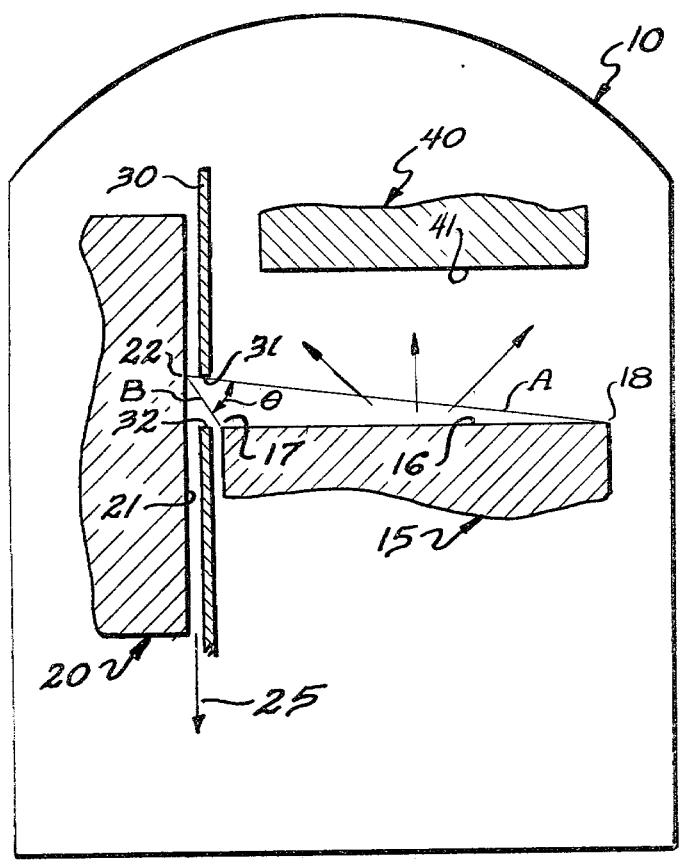

LINE-OF-SIGHT DEPOSITION METHOD

CONTRACTUAL ORIGIN OF THE INVENTION

The invention described herein was made in the course of, or under, a contract with the U.S. DEPARTMENT OF ENERGY.

BACKGROUND OF THE INVENTION

The present invention relates to crystalline and amorphous films produced by line-of-sight low pressure (non-scattering) processes such as evaporation or sputtering in which molecular or atomic-size particles are removed from a target of a selected source (target and source are used interchangeably herein) by either the use of thermal energy in the case of evaporation or the use of controlled ion bombardment in the case of sputtering and deposited on a substrate to form a coating or film of the source material on the substrate.

The deposited films may exhibit columnar microstructures, with the details of the microstructure depending on deposition parameters such as with respect to sputtering the nature of the adatom flux (energy distribution, density, composition, angle of incidence etc.) and the conditions at the substrate surface (nucleation sites, surface finish, impurities, surface temperature etc.). It is probable that geometric shadowing is involved in the development of these columnar growth features, with the columnar structure being more pronounced with increasing proportion of low angle incidence adatoms and with increasing surface roughness providing more effective shadowing sites. The bondaries between these columnar regions or growth sites may be gaps between isolated growth structures resulting in a reduced deposit density. It is desirable for preparing many materials, for example, certain magnetic materials or materials useful for their magnetic properties, certain semiconductor materials, and materials useful for their optical properties, to provide coatings which are close to theoretical density.

Sputtering is the process of removing molecular or atomic-size particles from the target by controlled ion bombardment. In the case of triode sputtering, the target or source and the substrate are separately formed from the anode and cathode. The system is placed in a low-pressure, inert atmosphere and with the anode held positive with respect to the cathode, electrons emitted by the cathode are attracted toward the anode. The release of electrons is accomplished by placing a high potential between the anode and the cathode or by using a heated or therminoic cathode. The electron current between the cathode and the anode causes a gas discharge, or plasma, to form in the space between electrodes, due to ionization of the inert gas. The plasma consists of a cloud of negative electrons and a similar cloud of positive ions leaving the plasma substantially neutral.

The target and the substrate are placed in the plasma, and the target is maintained at a potential negative with respect to the ionized plasma. This serves to attract the positively charged plasma ions toward the target. These ions arrive perpendicular to the target surface at a level of energy equivalent to the target potential. This bombardment dislodges molecular or atomic-size particles of the target material by momentum transfer processes. There sputtered atoms are moving rapidly (kinetic energy on the order of a few electron volts) and many of them strike the substrate where they form a deposited coating or film. Ejection from the target surface is such that in general (certain alloys and packed crystal structure excepted), flux density is proportional to the cosine of the angle of ejection and is maximum normal to the target surface and minimum parallel to the target surface.

Previously, dense coatings have been obtained by positioning the selected source or target material substantially parallel to and generally opposite the selected substrate material while maintaining the area of the selected target or source material relatively small in order to limit the shadowing due to particles impinging upon the substrate at varying angles of incidence. One of the problems with this method is low deposition rates resulting from low flux densities. Generally, the target surface area cannot be increased to increase the flux density without incurring increased columnar defects. Increasing the energy to the target in order to increase flux density can result in melting the target surface or overheating the substrate or both.

As the target area is increased in an attempt to obtain a higher flux density there is an increase in the shadowing due to the arrival of particles at the substrate surface at varying angles of incidence leading to more or increased columnar defect shadowing, that is defect structure or leaders parallel to the angle of incidence of the incoming particles. Retaining the parallel target and substrate configuration along with maintaining a relatively small target area inevitably results in low flux densities. Flux density also cannot be increased by increasing the power input because for sputtering, which is a momentum transfer phenomenon, only a small amount of the energy of the incident ions is used to dislodge molecular or atomic-size particles from the target, the rest of the energy being converted to heat. Therefore, with sputtering, target cooling capabilities in large part determine the maximum acceptable power input.

It is possible to use high substrate temperatures to increase the mobility of the atoms being deposited in order to obtain high density deposits of thin films rather than attempting to limit the angles of incidence of the deposited particles. However, it is often desirable to retain deposits in a form produced by low substrate temperatures, resulting in fine grain size and uniform composition. High substrate temperatures would preclude this. Further, high substrate temperatures may result in other undesirable effects such as alloying reactions between the substrate and the material being deposited.

Accordingly, for many purposes in order to obtain close to theoretical density coatings with line-of-sight (low pressure non-scattering) processes the customary target to substrate configurations necessarily result in low deposition rates due to poor flux densities.

U.S. Pat. No. 3,494,852 issued Feb. 10, 1970 to M. Doctoroff for A Collimated Duoplasmatron-Powered Deposition Apparatus relates to production of duoplasmatron ion beam used to deposit high density film on a substrate.

U.S. Pat. No. 3,494,853 issued Feb. 10, 1970 to D. E. Anderson et al. for Vacuum Deposition Apparatus Including a Programmed Mask Means Having a Closed Feedback Control System relates to a universal mask system for depositing a material from the souce or target at a preselected area of the substrate.

U.S. Pat. No. 3,654,123 issued Apr. 4, 1972 to Hajzak for Sputtering relates to a device to achieve controlled coatings by sputtering in which continuous relative movement between the plasma and the substrate is achieved.

U.S. Pat. No. 3,669,860 issued June 13, 1972 to Knowles et al. for Method and Apparatus for Applying a Film to a Substrate Surface by Diode Sputtering discloses a diode sputtering apparatus including means for cooling the substrate to prevent overheating during deposition.

U.S. Pat. No. 3,761,375 issued Sept. 25, 1973 to J. T. Pierce et al. for Process For Fabricating Vidicon Tube Target Having A High Resistance Sputtered Semi-Insulating Film discloses an R.F. sputtering process for semiconductor substrates in which the high resistance deposited film functions as a charge carrier path.

U.S. Pat. No. 3,779,891 issued Dec. 18, 1973 to Vegh et al. for Triode Sputtering Apparatus discloses a target material including two members with the surfaces thereof angularly disposed.

U.S. Pat. No. 3,829,373 issued Aug. 13, 1974 to M. R. Kuehnle for Thin Film Deposition Apparatus Using Segmented Target Means shows a device with the substrate means arranged on the exterior of a cylindrical drum for rotation with respect to circumferentially spaced arcuate target segments coaxially arranged with the drum.

U.S. Pat. No. 4,014,779 issued Mar. 29, 1977 to M. R. Kuehnle for Sputtering Apparatus discloses a sputtering machine having a rotary anode insulated from the supporting structure and maintained at a voltage differential with respect to the supporting structure.

U.S. Pat. No. 4,119,881 issued Oct. 10, 1978 to Caldron for Ion Beam Generator Having Concentrically Arranged Frustoconical Accelerating Grids discloses a grid system for an ion beam generator having a frustoconical shape so that the collimated ion beam converges at a predetermined angle to provide selective beveled etching of the target.

SUMMARY OF THE INVENTION

This invention relates to a method for producing theoretically dense coatings with low pressure, line-of-sight processes at deposition rates in excess of presently obtainable rates.

An object of the present invention is to provide a method of depositing a dense film of material on a substrate from a source of material at low pressure comprising providing a source of material having a surface thereof capable of emitting particles therefrom and a substrate within a pressure vessel maintained at low pressure, positioning the surface of the substrate receiving the particles substantially perpendicular to the source surface, and causing particles of material to leave the source surface and impinge upon the substrate surface.

Another object of the present invention is to provide a method of depositing a dense film of material on a substrate from a source of the material at low pressure comprising providing a source of material having a surface capable of emitting particles therefrom and a substrate within a pressure vessel maintained at low pressure, the substrate surface receiving the particles and the source surface being positioned such that all of the adatom flux arrives substantially perpendicularly to the substrate surface, that is, such that none of the adatom flux arrives at grazing incidence to the substrate. This requires that the substrate surface be oriented substantially perpendicular to the target surface and that the angular dispersion $\theta$ of the adatom flux be small. Typically, $\theta$ may be restricted to less than about 45°. Here $\theta$ is the angle between A and B where: A is a straight line between a point on the substrate surface most remote from the source surface and a point on the source surface most remote from the substrate surface, and where A is approximately perpendicular to the substrate surface and B is a straight line between a point on the substrate surface most remote from the source surface and a point on the source surface closest to the substrate surface, and causing particles of the material to leave the source surface and impinge upon the substrate surface.

Still another object of the present invention is to provide a low pressure method of the type set forth in which the source and the substrate are positioned such that the angle of incidence of the particles impinging upon the surface of the substrate is in the range of between about 45° and about 90°, and the source surface is positioned relative to the substrate surface such that the distances the particles travel from the source surface to the substrate surface vary greatly with some particles travelling distances substantially greater than other particles.

A still further object of the present invention is to provide a low pressure method of the type set forth in which the surface of the substrate receiving the particles and the source surface are positioned such that the source surface is substantially parallel to the direction of the particles impinging the substrate.

Another object of the invention is to provide a method including providing a pressure vessel housing a source of material having a surface thereof capable of emitting an adatom flux therefrom and a substrate, positioning the source and substrate surfaces such that the source surface is substantially parallel to the adatoms impinging the substrate surface, the distance between the most remote portion of the substrate surface receiving the adatom flux and the source surface emitting the adatom flux being relatively small, and establishing and maintaining an ion plasma within the pressure vessel at a pressure of less than about 5 microns sufficient to cause an adatom flux to leave the source surface and impinge upon the substrate surface.

These and other objects of the present invention may more readily be understood when taken in conjunction with the accompanying specification and drawing, in which:

BRIEF DESCRIPTION OF THE DRAWING

FIG. 1 is a schematic illustration of the invention in a sputtering environment particularly illustrating the relationship of the target or source material and the substrate.

DESCRIPTION OF THE PREFERRED EMBODIMENT

Referring now to the single FIGURE of the drawing, there is schematically disclosed a sputtering system including a pressure vessel 10 illustrated without the standard vacuum means, source of inert gas, anode and cathode and electrical potential applying means, all standard in the art and illustrated in several of the U.S. Patents previously cited herein. The pressure vessel 10 is capable of holding a substantial vacuum with the preferred pressures being less than about 5 microns. A target or source material 15 is positioned with the flat planar surface 16 thereof capable of emitting molecules or atomic-size particles in directions noted by the arrows (unnumbered), as is well know in the sputtering art. The target 15 has a near point 17 and a far point 18. A substrate 20 is positioned with the flat planar surface 21 to receive material sputtered from the surface 16 of the source 15 arranged perpendicularly to the surface 15, the substrate 20 having a far point 22 thereof, as will be discussed.

A mask 30 is interposed between the substrate 20 and the source 15 and preferably interposed such that the mask 30 is substantially parallel to the surface 21 of the substrate 20 receiving material thereon. The mask 30 is provided with an opening therein in the form of a slit or the like having an upper edge 31 and a lower edge 32, preferably the lower edge 32 of the mask 30 is coplanar with the surface 16 of the target or source 15. Means (not shown) provide relative movement between the substrate 20 and the source 15 and as illustrated by the arrow 25 provides movement of the substrate 20 in the direction of the arrow 25 with respect to the source 15, which remains fixed. Finally, there is provided a collector 40 having a surface 41 for collecting material emitted from the source 15 in order to conserve sputtered material. The collector 40 and the surface 41 thereof is positioned in the manner heretofore generally utilized in the sputtering art for depositing dense films on a substrate, but in the subject invention the collector 40 is present merely to conserve sputtered material.

Although the invention pertains to all line-of-sight processes for producing crystalline and amorphous films, including both evaporation and sputtering, sputtering has been selected as a convenient means for illustrating the present invention. Although the invention is illustrated with the inclusion of a mask 30 and relative movement of the source 15 and the substrate 20, it should be understood that relative movement is not necessary, but preferred and becomes necessary if the substrate surface 21 to be coated becomes larger. Relative movement is preferred because the beam of adatom flux striking the substrate surface 21 is not uniform but is most concentrated at the center, resulting in uneven thickness of the deposited film if relative movement between the substrate 20 and the source 15 is not provided. By moving the substrate 20 in the direction of the arrow 25, the most concentrated portion of the adatom flux beam strikes all portions of the surface 21 evenly, thereby laying down a uniformly thick film.

The basic limitation on the geometry of the relationships between the source 15 and the substrate 20 is that the angles of incidence of particles impinging upon surface 21 be in the range of from about 45° to about 90°. This limitation implies that the angle $\theta$ formed by the intersection of lines A and B be less than about 45°, where A is a straight line between the far points 18 and 22 respectively on the source 15 and the substrate 20 and A is also approximately perpendicular to the substrate surface 21 and B is a straight line between the near point 17 of source 15 and far point 22 of the substrate. If this geometric limitation for the source 15 and the substrate 20 is observed, then the paths of the particles impinging upon the surface 21 will be substantially parallel to the source 16 and perpendicular to the substrate 21 and a high quality close to 100% theoretically dense film will be laid down. However, within the above set forth critical geometric limitations, there are preferred geometric relationships.

The distance between the substrate surface 21 receiving the sputtered material or adatom flux and the near point 17 of the source 15 along a line normal to the surface 21 (horizontal distance) should be as close as possible while ensuring that electrical isolation is maintained between the source 15 and the substrate 20. The above factor is somewhat dependent upon the electrical potential and pressure of the system, whereby rigid values cannot be set forth.

Another part of the geometric configuration between the source 15 and the substrate 20 is the distance between the far point 22 on the substrate 20 and the plane of the source surface 16 along a line normal to the surface 16. This vertical distance should be as small as possible, preferably in the order of $\frac{1}{8}$ inch with angles of incidence becoming lower and the film density becoming less with an increase in the distance between the far point 22 on the substrate 20 and the source surface 16.

In this art, that is, line-of-sight deposition of material, there is no quick or absolute cutoff point beyond which a process suddenly becomes inoperable; on the other hand continued degradation of film properties occurs as a number of parameters to be discussed vary from the optimum. So in the case of the vertical distance measurement between the far point 22 on the substrate and the plane of the source surface 16, the optimum or preferred distance is $\frac{1}{8}$ inch or less with the film density continually degraded as the distance increases, and similarly the horizontal distance from the substrate surface 21 to the source 17 should be small, with the increases thereof diminishing the flux density and therefore the deposition rate.

Another parameter which affects the deposition rate of the coating is the pressure within the pressure vessel 10. Preferably, the pressure is maintained at a vacuum less than about 3 microns pressure and generally in the range of from between about 1 micron to about 3 microns. Increasing the pressure within vessel 10 results in increased scattering of the adatom flux, resulting in lower flux densities and less material deposited per unit time, but an increase in pressure beyond about 5 microns takes the process out of the low pressure, line-of-sight art. Accordingly, the system pressure must be maintained at less than about 5 microns, preferably within the 1 to 3 micron range. Increasing the pressure decreases the mean free path (the average distance between collisions of particles and gas molecules) resulting in increased scattering. Pressure also affects the maximum distance adatoms can travel without scattering collisions and therefore determines the maximum length of A and the maximum effective target size 16 for which line-of-sight material can remain nearly parallel until arrival at the substrate, with this distance being limited to about twice the mean free path, whereby low pressure is preferred.

In order to lay down a dense coating close to 100% theoretical density, A should be nearly perpendicular to the substrate surface 21, $\theta$ cannot exceed 45° and preferably $\theta$ should be less than about 30° and B must not intersect the substrate surface at less than 45°. The most optimum conditions are if $\theta$ is in the range of between about 1° and about 5° and A is perpendicular to 21 within 5°. Where $\theta$ is less than about 30° and preferably in the range of between about 1° and about 5°, the particle paths of the adatom flux striking the substrate surface 21 are substantially parallel with each other and the angle of incidence of the adatom flux to the substrate surface 21 is substantially 90° if A is substantially perpendicular to 21. Under these conditions, the paths of the deposited adatom flux are substantially parallel to the source surface 16 and perpendicular to the substrate surface 21 and a film having substantially 100% theoretical density can be laid down or deposited on the surface 21 of the substrate 20.

An important feature of the present invention is the ability to increase flux densities of the adatom flux impinging upon the surface 21 of the substrate 20 by increasing the length or area of the source 15. As previously discussed in prior art devices and processes, it is difficult to increase the area of the source or target 15 contributing to the adatom flux without simultaneously degrading the density and quality of the film or material laid down during sputtering due to the increased shadowing inherently resulting from an increase in the dispersion $\theta$ of the flux attending an increase in the target or source area.

The inventive process permits substantially increased flux densities and therefore substantially higher deposition rates than presently available because the area of the target or source 15 can be greatly increased to increase flux density without adversely affecting the film density or quality. By limiting the vertical distance (as defined) of the far point 22 on the substrate surface 21 to approximately ⅛ inch above the plane of the source surface 16, the effective length of the source 15 may be increased substantially over the sources presently in use. For instance, the longest dimension of sources presently used in the previously described system may be from about 4 to 5 inches, whereas in the present invention the length of the source 15 may be substantially greater than 20 inches without degrading the properties of the film laid down on the substrate surface 21. So long as the limiting factors of incidence angle and $\theta$ are maintained and so long as pressure is low enough to preclude scattering the area of the source 15 may be increased as desired to increase flux density. Of course, flux density does vary inversely proportional to the square of the distance between source 15 and substrate 20 so as a practical matter there will be a point beyond which it is not efficient to separate the source and substrate.

With the geometry of the present invention, it will be apparent that targets or sources 15 of very long lengths (large area) may be used in the process without degrading the desirable properties of the film or material laid down on the substrate surface 21. Even with source surfaces 16 in the neighborhood of about 9 or 10 inches in longest dimension, it will be apparent that some of the particles of adatom flux travel substantially greater distances than other particles before impingement upon the surface 21 of the substrate 20. This feature distinguishes the inventive process from known processes wherein the paths of travel for all portions of the adatom flux are substantially the same.

By the use of a mask 30 and relative movement of the source 15 and substrate 20, relatively large substrates can be coated while the system geometry is maintained. Also, during sputtering the plane of surface 16 changes as material leaves the surface and this change in the position of surface 16 affects the system geometry so that movement of the mask 30 relative to the surface 16 may be employed to maintain the system geometry. As may be understood from the system, the vast majority of the material sputtered from the surface 16 will not impinge on the substrate 20 and for this reason a collector 40 can be employed to conserve material for later use.

When a 316 stainless steel target 15 was sputtered in a triode sputtering system maintained at about 3 to 4 microns, a film was deposited on a copper substrate 20 at a rate of about 1 mil per hour. A collector 40 received a deposited film at a rate of only about 2 mil per hours. In the above case the source or target 15 was a cylinder having about a 4 inch diameter so that deposition rates can be significantly increased by increasing the target sputtering surface. The film deposited on the copper substrate 20 was 100% of theoretical density.

The invention has been described in relation to planar surfaces for both source 15 and substrate 20 because this is the simplest situation to describe; however, the invention is not so limited. Cylindrical or spherical targets or substrates are well within the scope of the invention as are various combinations of planar and arcuate or sinuous surfaces, either as target or substrate or both. So long as the geometric system parameters previously described are observed, the process will function irrespective of target or source shape.

The invention heretofore described is a line-of-sight process for depositing dense films at good deposition rates in which the paths of the deposited particles of material are substantially parallel to the target surface and impinge upon the substrate at incident angles within the range of from about 45° to about 90° and preferably between about 60° and 90°. $\theta$ as herein defined should be maintained less than 45° and preferably less than about 30°. By observing the above geometric parameters, target surfaces can be substantially increased to improve flux densities without diminishing film density.

While there has been described what at present is considered to be the preferred embodiment of the present invention various modifications or alterations may be made therein without departing from the scope of the invention, and it is intended to cover in the claims appended hereto several such modifications and alterations.

The embodiments of the invention in which an exclusive property or privilege is claimed are defined as follows:

1. In a method of depositing a dense film of material on a substrate from a source of material at low pressure, said method comprising providing a source of material having a surface thereof capable of emitting particles therefrom and a substrate within a pressure vessel maintained at a pressure of less than about 5 microns, positioning the surface of the substrate receiving the particles substantially perpendicular to the source surface, and causing particles of the material to leave the source surface and impinge upon said substrate surface, the improvement comprising interposing a mask having an opening therein between said source and substrate so that all particles impinging on said substrate surface directly from said source have an angle of incidence to the substrate surface of between 60° to 90°.

2. The method of claim 1, wherein said source and said substrate are maintained at pressures less than about 3 microns during deposition of the film.

3. The method of claim 1, and further providing relative movement between said source and said substrate surface while interposing said mask therebetween so that said particles impinge upon the substrate surface at an incidence angle substantially perpendicular to said substrate surface.

4. A method of depositing a dense film of material on a substrate from a source of the material at a pressure of less than about 5 microns, said method comprising providing a source of material having a surface capable of emitting particles therefrom and a substrate within a pressure vessel maintained at said pressure, the substrate surface receiving the particles and the source surface being positioned substantially perpendicular to each other and such that $\theta$ is in the range of about 1° to about 5° and $\theta$ is the angle between A and B where: A is a straight line between a point on the substrate surface most remote from the source surface and a point on the source surface most remote from the substrate surface and B is a straight line between a point on the substrate surface most remote from the source surface and a point on the source surface closest to the substrate surface, and causing particles of the material to leave said surface and impinge upon said substrate surface.

5. The method of claim 4, wherein the pressure within said pressure vessel is less than about 3 microns, and an ion plasma is established and maintained within the pressure vessel sufficient to cause an adatom flux to leave the source surface and impinge upon the substrate surface.

6. The method of claim 4, wherein the substrate surface and the source surface are positioned such that the source surface is substantially parallel to the directions of the particles impinging the substrate surface.

7. A method of depositing a dense film material on a substrate from a source of the material, said method comprising providing a pressure vessel housing a source of material having a plane surface thereof capable of emitting an adatom flux therefrom and a substrate, positioning the source surface and the substrate surface such that the plane of the source surface is substantially parallel to the direction of the particles impinging upon the substrate surface, the distance between the most remote point of said substrate surface receiving the adatom flux and the plane of said source surface emitting the adatom flux as measured in a direction perpendicular to the source surface being about ⅛ inch, and establishing and maintaining an ion plasma within said pressure vessel at a pressure of less than about 5 microns sufficient to cause an adatom flux to leave said source surface and impinge upon said substrate surface to deposit a coating at close to theoretical density at a rate of about 1 mil per hour.

8. The method of claim 7, wherein the source surface and the substrate surface are positioned such that the angles of incidence of the particles impinging upon the substrate surface are in the range of from about 60° to about 90°.

9. The method of claim 7, wherein the substrate surface and the source surface are positioned such that $\theta$ is in the range of about 1° to about 5° and $\theta$ is the angle between A and B where: A is a straight line between a point on the substrate surface most remote from the source surface and a point on the source surface most remote from the substrate surface and B is a straight line between a point on the substrate surface most remote fromm the source surface and a point on the source surface closest to the substrate surface.

10. The method of claim 7, wherein the distance between the source surface and the substrate surface in a direction perpendicular to the substrate surface is up to about two means free paths.

11. The method of claim 7, wherein relative movement is provided between said source and said substrate and a mask is provided intermediate said source and said substrate having a defined opening therein.

12. The method of claim 11, wherein relative movement is provided between said mask and said source.

13. The method according to claim 1 wherein said particles impinge on said substrate surface at a rate sufficient to deposit source material at about 1 mil per hour at close to theoretical density.

* * * * *